(12) United States Patent
Ho et al.

(10) Patent No.: US 7,965,551 B2
(45) Date of Patent: Jun. 21, 2011

(54) METHOD FOR METAL BIT LINE ARRANGEMENT

(75) Inventors: Wen-Chiao Ho, Guanmiao Township, Tainan County (TW); Kuen-Long Chang, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 745 days.

(21) Appl. No.: 11/703,115

(22) Filed: Feb. 7, 2007

(65) Prior Publication Data

US 2008/0186769 A1    Aug. 7, 2008

(51) Int. Cl.
    *G11C 11/34*    (2006.01)
(52) U.S. Cl. ......... 365/185.05; 365/185.11; 365/185.16; 365/185.17; 365/185.18; 365/185.25
(58) Field of Classification Search ............. 365/185.05, 365/185.11, 185.16, 185.17, 185.18, 185.25
    See application file for complete search history.

(56) References Cited

U.S. PATENT DOCUMENTS

| | | | | |
|---|---|---|---|---|
| 5,274,588 A * | 12/1993 | Manzur et al. | ........... | 365/185.16 |
| 5,517,448 A * | 5/1996 | Liu | ........... | 365/185.11 |
| 5,756,400 A | 5/1998 | Ye et al. | | |
| 5,862,076 A * | 1/1999 | Eitan | .......... | 365/185.16 |
| 5,875,128 A * | 2/1999 | Ishizuka | .......... | 365/185.11 |
| 5,966,327 A * | 10/1999 | Jo | .......... | 365/185.11 |
| 6,088,265 A * | 7/2000 | Ohta | .......... | 365/185.16 |
| 6,147,910 A * | 11/2000 | Hsu et al. | .......... | 365/185.25 |
| 6,525,969 B1 | 2/2003 | Kurihara et al. | | |
| 6,744,667 B2 * | 6/2004 | Yamamoto et al. | ...... | 365/185.16 |
| 6,826,080 B2 * | 11/2004 | Park et al. | .......... | 365/185.16 |
| 7,221,587 B2 * | 5/2007 | Yamashita et al. | ....... | 365/185.16 |

\* cited by examiner

*Primary Examiner* — Trong Phan
(74) *Attorney, Agent, or Firm* — Rabin & Berdo, P.C.

(57) ABSTRACT

A method for metal bit line arrangement is applied to a virtual ground array memory having memory cell blocks. Each memory cell block has memory cells and m metal bit lines, wherein m is a positive integer. The method includes the following steps. First, one of the memory cells is selected as a target memory cell. When the target memory cell is being read, the metal bit line electrically connected to a drain of the target memory cell is a drain metal bit line, and the metal bit line electrically connected to a source is a source metal bit line. Next, a classification of whether the other metal bit lines are charged up when the target memory cell is being read is made. Thereafter, the m metal bit lines are arranged such that charged up metal bit lines are not adjacent to the source metal bit line.

6 Claims, 3 Drawing Sheets

300 Memory cell block

_US 7,965,551 B2_

METHOD FOR METAL BIT LINE ARRANGEMENT

BACKGROUND OF THE INVENTION

1. Field of the Invention

The invention relates in general to a method for metal bit line arrangement, and more particularly to a method for metal bit line arrangement without coupling effects.

2. Description of the Related Art

FIG. 1 (PriorArt) is a partial circuit diagram showing a memory cell block 100 of a conventional memory. Referring to FIG. 1, the memory cell block 100 includes memory cells T1 to T16, metal bit lines MBL0 to MBL7 and select transistors respectively controlled by select signals SEL0 to SEL7. In FIG. 1, the memory cells T1 to T16 are multi-bit cells, for example, and each memory cell has, without limitation to, two half cells.

Taking the memory cell T4 serving as a target memory cell as an example, when a left half cell hc6 of the memory cell T4 is to be read, the select signal SEL4 turns on the select transistor ST1 so that the drain D of the memory cell T4 is electrically connected to the metal bit line MBL0. Meanwhile, the select signal SEL3 turns on the select transistor ST2 so that the source S of the memory cell T4 is electrically connected to the metal bit line MBL3. Thereafter, a cell current $I_{cell}$ flowing from the drain D of the memory cell T4 to the source S of the memory cell T4 is sensed through the metal bit line MBL3 using the source side sensing technology, and the cell current $I_{cell}$ and a reference current $I_{ref}$ outputted from a reference unit (not shown) are compared with each other to judge the data stored in the left half cell hc6 of the memory cell T4.

However, when the memory cell T4 is being read, the memory cells T5 to T16 at the right side of the drain D are charged up. Because the select signal SEL3 also turns on the select transistor ST4, the metal bit line MBL7 is charged up. In addition, the select signal SEL4 also turns on the select transistor ST3 simultaneously, so the metal bit line MBL4 is charged up. Because the metal bit line MBL4 is disposed adjacent to the metal bit line MBL3, so the charging of the metal bit line MBL4 will produce the coupling effect to MBL3, and the reading window of the memory cell T4 is greatly reduced. Consequently, the cell current $I_{cell}$ sensed through the metal bit line MBL3 becomes incorrect and thus influences the correctness of reading the data stored in the left half cell hc6 of the memory cell T4. In order to reduce the influence caused by the coupling effect, a complicated circuit usually has to be utilized to remove the coupling effect. Consequently, the memory area is enlarged and the cost is increased.

SUMMARY OF THE INVENTION

The invention is directed to a method for metal bit line arrangement. Re-arranged metal bit lines are utilized, such that the metal bit line electrically connected to the source of a memory cell is not disposed adjacent to other metal bit lines, which are charged up unexpectedly when the memory cell is being read. Thus, no coupling effect will occur, and the memory can correctly read the data stored in the memory cell using the source side sensing technology.

According to the present invention, a method for metal bit line arrangement is provided. The method is applied to a memory, which is a virtual ground array memory and has memory cell blocks. Each of the memory cell blocks has memory cells, select transistors and m metal bit lines, wherein m is a positive integer. The method includes the following steps. First, one of the memory cells is selected as a target memory cell. When the target memory cell is being read, the metal bit line electrically connected to a drain of the target memory cell is defined as a drain metal bit line, and the metal bit line electrically connected to a source of the target memory cell is defined as a source metal bit line. Next, a classification of whether the other metal bit lines are charged up when the target memory cell is being read is performed. Thereafter, the m metal bit lines are arranged such that a charged up metal bit lines are not adjacent to the source metal bit line. The memory senses a cell current outputted from the target memory cell through the source metal bit line to judge data stored in the target memory cell.

The invention will become apparent from the following detailed description of the preferred but non-limiting embodiment. The following description is made with reference to the accompanying drawings.

DETAILED DESCRIPTION OF THE INVENTION

The invention provides a method for metal bit line arrangement, which is applied to a memory. The memory is a virtual ground array memory. Re-arranged metal bit lines are utilized such that the metal bit line electrically connected to the source of a memory cell is not disposed adjacent to other metal bit lines, which are charged up unexpectedly when the memory cell is being read. Thus, no coupling effect will occur, and the memory can correctly read the data stored in the memory cell using the source side sensing technology.

Figure 2:
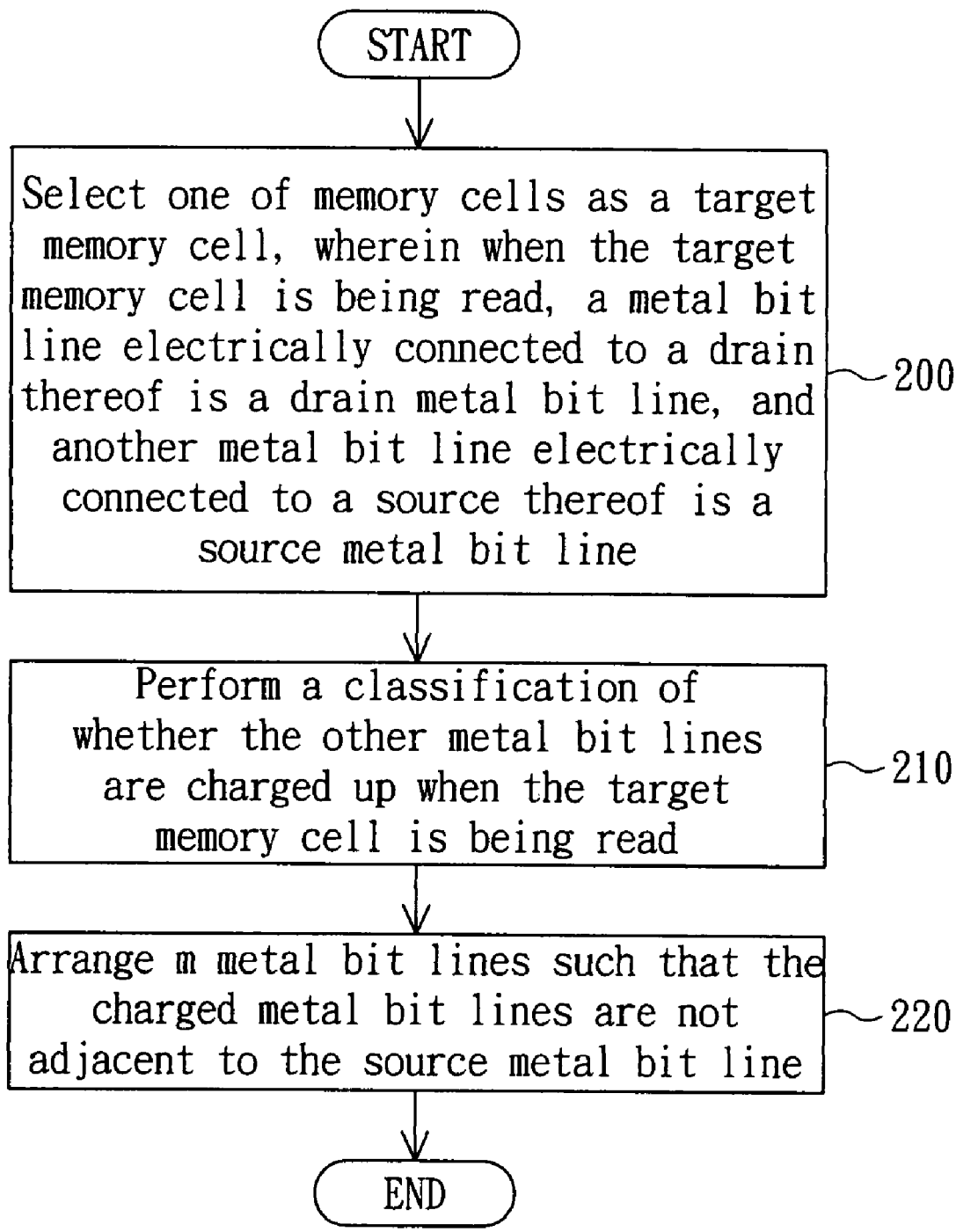
FIG. 2 is a flow chart showing a method for metal bit line arrangement according to a preferred embodiment of the invention.

FIG. 2 is a flow chart showing a method for metal bit line arrangement according to a preferred embodiment of the invention. This method for metal bit line arrangement is applied to a memory, such as a virtual ground array memory. The memory has many memory cell blocks each having many memory cells, m metal bit lines and many select transistors. These select transistors are controlled by n select signals, wherein m and n are positive integers. The memory uses the source side sensing technology to sense a cell current outputted from a target memory cell through a source metal bit line so as to judge the data stored in the target memory cell.

First, in step 200, one of the memory cells is selected as a target memory cell. When the target memory cell is being read, the metal bit line electrically connected to a drain of the target memory cell is defined as a drain metal bit line, the metal bit line electrically connected to a source of the target memory cell is defined as a source metal bit line. When the target memory cell is being read, a first select signal of the n select signals turns on a first select transistor of the select transistors so that the drain of the target memory cell is electrically connected to the drain metal bit line, and a second select signal of the n select signals turns on a second select transistor of the select transistors so that the source of the target memory cell is electrically connected to the source metal bit line.

Then, in step 210, a classification of whether the other metal bit lines are charged when the target memory cell is being read is made. When the target memory cell is being read, the drain metal bit line influences the other memory cells on a side of the drain of the target memory cell. At this moment, the first select signal also turns on a third select transistor of the select transistors so that a first metal bit line of the m metal bit lines is charged up, and the second select signal also turns on a fourth select transistor of the select transistors so that a second metal bit line of the m metal bit lines is charged up.

Next, in step 220, the m metal bit lines are arranged so that the charged up metal bit lines are not adjacent to the source metal bit line, that is, the first metal bit line and the second metal bit line are not adjacent to the source metal bit line. Consequently, the charged up metal bit lines and the source metal bit lines do not produce the coupling effect, which disables the memory from correctly sensing the cell current through the source metal bit line and from correctly judging the data stored in the target memory cell. Step 220 is substantially an essential condition with respect to the method for metal bit line arrangement according to this embodiment. Then, the method for metal bit line arrangement of this embodiment further arranges the m metal bit lines so that the drain metal bit line is not adjacent to the source metal bit line. It is substantially a non-essential condition with respect to the method for metal bit line arrangement according to this embodiment. That is, in the precondition that the charged up metal bit lines are not adjacent to the source metal bit line, the drain metal bit line is possibly not adjacent to the source metal bit line.

Figure 1:
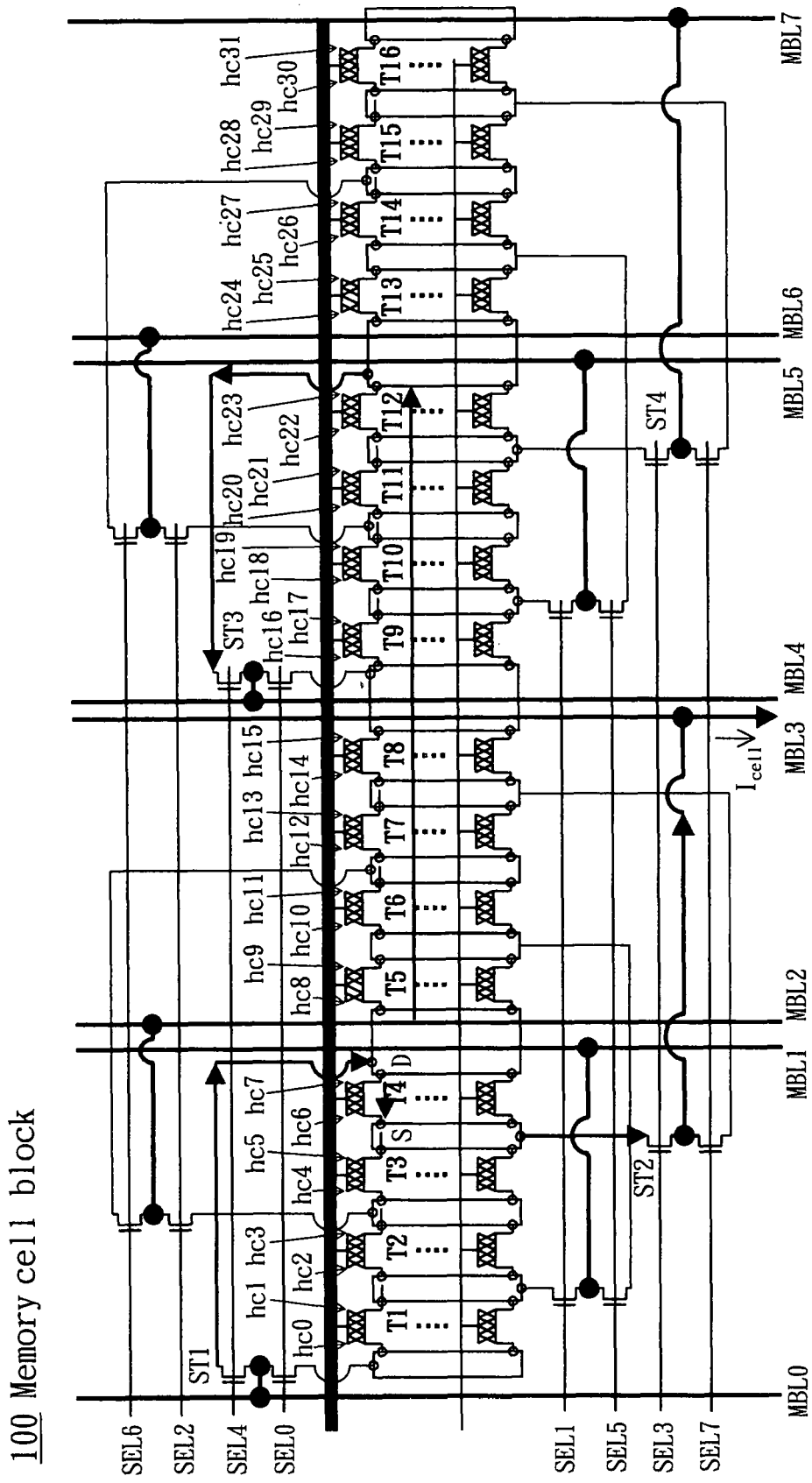
FIG. 1 (Prior Art) is a partial circuit diagram showing a memory cell block of a conventional memory.

The non-restrictive memory cell block 100 of FIG. 1 will be described as an example. The memory cell block 100 is one of the memory cell blocks of the memory, and the memory cell block 100 includes 16 memory cells T1 to T16, eight metal bit lines MBL0 to MBL7 and many select transistors. These select transistors are respectively controlled by eight control signals SEL0 to SEL7. The 16 memory cells T1 to T16 to be described are two-bit cells, for example, and totally include, without limitation to, half cells hc0 to hc31. Taking the memory cell T4 serving as the target memory cell as an example, the drain metal bit line is the metal bit line MBL0, the source metal bit line is the metal bit line MBL3, and the charged up metal bit lines are the metal bit line MBL4 and the metal bit line MBL7 when the left half cell of the memory cell T4 is to be read. The method for metal bit line arrangement according to this embodiment is to make the charged up metal bit line MBL4 and the charged up metal bit line MBL7 be not adjacent to the source metal bit line MBL3.

Table 1 is a read condition table showing the 32 half cells hc0 to hc31 of the memory cell block 100, wherein "No." represents the number of the half cell, "D" represents the drain metal bit line electrically connected to the drain of the target memory cell, "S" represents the source metal bit line electrically connected to the source of the target memory cell, "SEL(ON)" represents the select signal for turning on the select transistor, and "Charge Up" represents the charged up metal bit lines that are not electrically connected to the target memory cell.

TABLE 1

| No. | D | S | SEL(ON) | Charge Up |
|---|---|---|---|---|
| 0 | MBL1 | MBL0 | SEL(0, 1) | MBL(4, 5) |
| 1 | MBL0 | MBL1 | SEL(0, 1) | MBL(4, 5) |
| 2 | MBL2 | MBL1 | SEL(1, 2) | MBL(5, 6) |
| 3 | MBL1 | MBL2 | SEL(1, 2) | MBL(5, 6) |
| 4 | MBL3 | MBL2 | SEL(2, 3) | MBL(6, 7) |

TABLE 1-continued

| No. | D | S | SEL(ON) | Charge Up |
|---|---|---|---|---|
| 5 | MBL2 | MBL3 | SEL(2, 3) | MBL(6, 7) |
| 6 | MBL0 | MBL3 | SEL(3, 4) | MBL(4, 7) |
| 7 | MBL3 | MBL0 | SEL(3, 4) | MBL(4, 7) |
| 8 | MBL1 | MBL0 | SEL(4, 5) | MBL(4, 5) |
| 9 | MBL0 | MBL1 | SEL(4, 5) | MBL(4, 5) |
| 10 | MBL2 | MBL1 | SEL(5, 6) | MBL(5, 6) |
| 11 | MBL1 | MBL2 | SEL(5, 6) | MBL(5, 6) |
| 12 | MBL3 | MBL2 | SEL(6, 7) | MBL(6, 7) |
| 13 | MBL2 | MBL3 | SEL(6, 7) | MBL(6, 7) |
| 14 | MBL4 | MBL3 | SEL(0, 7) | MBL(0, 7) |
| 15 | MBL3 | MBL4 | SEL(0, 7) | MBL(0, 7) |
| 16 | MBL5 | MBL4 | SEL(0, 1) | MBL(0, 1) |
| 17 | MBL4 | MBL5 | SEL(0, 1) | MBL(0, 1) |
| 18 | MBL6 | MBL5 | SEL(1, 2) | MBL(1, 2) |
| 19 | MBL5 | MBL6 | SEL(1, 2) | MBL(1, 2) |
| 20 | MBL7 | MBL6 | SEL(2, 3) | MBL(2, 3) |
| 21 | MBL6 | MBL7 | SEL(2, 3) | MBL(2, 3) |
| 22 | MBL4 | MBL7 | SEL(3, 4) | MBL(0, 3) |
| 23 | MBL7 | MBL4 | SEL(3, 4) | MBL(0, 3) |
| 24 | MBL5 | MBL4 | SEL(4, 5) | MBL(0, 1) |
| 25 | MBL4 | MBL5 | SEL(4, 5) | MBL(0, 1) |
| 26 | MBL6 | MBL5 | SEL(5, 6) | MBL(1, 2) |
| 27 | MBL5 | MBL6 | SEL(5, 6) | MBL(1, 2) |
| 28 | MBL7 | MBL6 | SEL(6, 7) | MBL(2, 3) |
| 29 | MBL6 | MBL7 | SEL(6, 7) | MBL(2, 3) |
| 30 | MBL0 | MBL7 | SEL(0, 7) | MBL(3, 4) |
| 31 | MBL7 | MBL0 | SEL(0, 7) | MBL(3, 4) |

The following Table 2 may be obtained by arranging the contents in Table 1. Table 2 is another read condition table showing the 32 half cells hc0 to hc31 of the memory cell block 100, wherein "S" represents the source metal bit line electrically connected to the source of the target memory cell, "Prohibition" represents the charged up metal bit lines that cannot be arranged aside the "S", "D" represents the drain metal bit line electrically connected to the drain of the target memory cell, "Select 1" represents the metal bit line satisfying "Prohibition" but is not "D", and "Select 2" represents the metal bit line satisfying "Prohibition". "Select 1" is the best selection of the adjacent metal bit lines, wherein the charged up metal bit lines, which are not electrically connected to the target memory cell, and the drain metal bit line are not adjacent to the source metal bit line. "Select 2" is the better selection of the adjacent bit lines, wherein the charged up metal bit lines, which are not electrically connected to the target memory cell, are not adjacent to the source metal bit line, but the drain metal bit line may be adjacent to the source metal bit line.

TABLE 2

| S | Prohibition | D | Select 1 | Select 2 |
|---|---|---|---|---|
| MBL0 | MBL3, 4, 5, 7 | MBL1, 3, 7 | MBL2, 6 | MBL1 |
| MBL1 | MBL4, 5, 6 | MBL0, 2 | MBL3, 7 | MBL0, 2 |
| MBL2 | MBL5, 6, 7 | MBL1, 3 | MBL0, 4 | MBL1, 3 |
| MBL3 | MBL0, 4, 6, 7 | MBL0, 2, 4 | MBL1, 5 | MBL2 |
| MBL4 | MBL0, 1, 3, 7 | MBL3, 5, 7 | MBL2, 6 | MBL5 |
| MBL5 | MBL0, 1, 2 | MBL4, 6 | MBL3, 7 | MBL4, 6 |
| MBL6 | MBL1, 2, 3 | MBL5, 7 | MBL0, 4 | MBL5, 7 |
| MBL7 | MBL0, 2, 3, 4 | MBL0, 4, 6 | MBL1, 5 | MBL6 |

Figure 3:
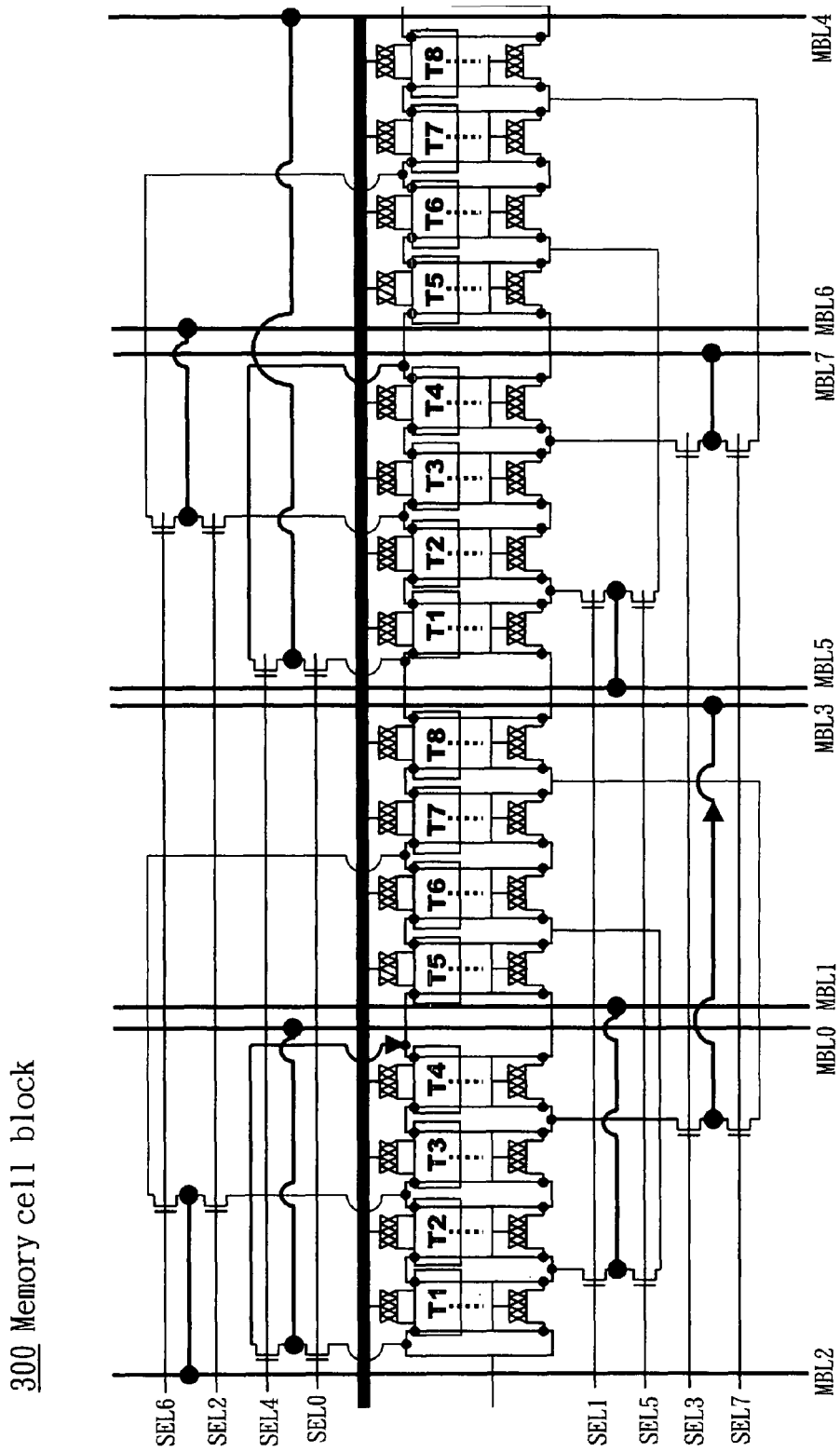
FIG. 3 is a partial circuit diagram showing a memory cell block according to a preferred embodiment of the invention.

After the screening of Table 2, the best arrangements of the eight metal bit lines include the following two combinations: (MBL2, MBL0 MBL1, MBL3, MBL5, MBL7, MBL6, MBL4), and (MBL2, MBL0, MBL1, MBL7, MBL6, MBL4, MBL5, MBL3). FIG. 3 is a partial circuit diagram showing a memory cell block according to a preferred embodiment of the invention. Referring to FIG. 3, in the memory cell block 300, the arrangement of the metal bit lines is (MBL2, MBL0

MBL1, MBL3, MBL5, MBL7, MBL6, MBL4) for example. In FIG. 3, the memory cell block 300 has many memory cells T1 to T8, metal bit lines MBL0 to MBL7 and select transistors respectively controlled by select signals SEL0 to SEL7. A source side sensing technology is used to sense a cell current outputted from a target memory cell through a source metal bit line so as to judge the data stored in the target memory cell. Any one of the memory cells T1 to T8 may be selected as the target memory cell, and the corresponding source metal bit line and drain metal bit line are accordingly decided as the target memory cell is selected. Therefore, the signs of the target memory cell and the source metal bit line and the drain metal bit line thereof are not given to any specific memory cell and metal bit lines in FIG. 3. In the memory cell block 300, the memory cells T1 to T8 to be described are two-bit cells, for example, and totally include, without limitation to, half cells hc0 to hc15. Taking the memory cell T4 serving as the target memory cell as an example, the drain metal bit line is the metal bit line MBL0, the source metal bit line is the metal bit line MBL3, and the charged up metal bit lines are the metal bit line MBL4 and the metal bit line MBL7 when the left half cell of the memory cell T4 is to be read. In FIG. 3, both of the charged up metal bit line MBL4 and the charged up metal bit line MBL7 are not adjacent to the source metal bit line MBL3.

In the two best arrangements of the metal bit lines, the charged up metal bit lines are not adjacent to the source metal bit line, and a few drain metal bit lines are adjacent to the source metal bit line. Consequently, when the target memory cell is being read, the charged up metal bit lines, which are not electrically connected to the target memory cell, and the source metal bit line of the target memory cell do not produce the coupling effect, and the reading window of the target memory cell will not be influenced. So, the data stored in the target memory cell may be correctly judged using the source side sensing technology. In addition, most of the drain metal bit lines are not adjacent to the source metal bit line, and the possibility of generating the error in the memory using the source side sensing technology may be decreased.

The method for metal bit line arrangement is not restricted to the above-mentioned two best arrangements of the metal bit lines. Other methods for metal bit line arrangement may be utilized such that the charged up metal bit lines are not adjacent to the source metal bit line, but more drain metal bit lines are adjacent to the source metal bit line. Consequently, although the overall behavior is poorer than the best arrangement of the metal bit lines, the coupling effect still can be eliminated.

The method for metal bit line arrangement according to the embodiment of the invention utilizes the mechanism of re-arranging the metal bit lines and is applied to the virtual ground array memory. Thus, when the memory cell is being read, the metal bit line electrically connected to the source of the memory cell is not adjacent to the metal bit lines charged up by the potential of the drain of the memory cell. So, the coupling effect produced using the source side sensing technology can be eliminated so that the memory can correctly sense the data stored in the memory cell through the source of the memory cell. In addition, because the embodiment of the invention only utilizes the mechanism of re-arranging the metal bit lines to solve the problem caused by the coupling effect but does not utilize the complicated circuit to eliminate the coupling effect. So, the area of the memory can be reduced and the cost can be lowered.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for metal line arrangement being applied to a memory, which is a virtual ground array memory and has a plurality of memory cell blocks, each of the memory cell blocks having a plurality of memory cells, a plurality of select transistors corresponding to the memory cells, and m metal bit lines corresponding to the memory cells, comprising a metal bit line 0, a metal bit line 1, . . . , and a metal bit line (m−1), wherein m is a positive integer, the m metal bit lines are respectively and electrically connected to the corresponding memory cells via the select transistors, the metal bit line electrically connected to a drain of a target memory cell of the memory cells is defined as a drain metal bit line, and the metal bit line electrically connected to a source of the target memory cell is defined as a source metal bit line, the method comprising the steps of:

arranging the m metal bit lines such that every charged up metal bit line of the arrangement is not adjacent to the source metal bit line, wherein
the select transistors are controlled by n select signals, and
when the target memory cell is being read, a first select signal of the n select signals turns on a first select transistor of the select transistors so that the drain of the target memory cell is electrically connected to the drain metal bit line, and a second select signal of the n select signals turns on a second select transistor of the select transistors so that the source of the target memory cell is electrically connected to the source metal bit line, n being a positive integer.

2. The method according to claim 1, further comprising the step of:
arranging the m metal bit lines so that the drain metal bit line is not adjacent to the source metal bit line.

3. The method according to claim 1, wherein when the target memory cell is being read, the first select signal turns on a third select transistor of the select transistors, the second select signal turns on a fourth select transistor of the select transistors, then a first and a second metal bit line of the m metal bit lines is charged up.

4. The method according to claim 3, wherein the m metal bit lines are arranged so that the first metal bit line and the second metal bit line are not adjacent to the source metal bit line.

5. The method according to claim 4, wherein m=8, and a best arrangements is, in order, the metal bit line 2, the metal bit line 0, the metal bit line 1, the metal bit line 3, the metal bit line 5, the metal bit line 7, the metal bit line 6, and the metal bit line 4.

6. The method according to claim 4, wherein m=8, and a best arrangements is, in order, the metal bit line 2, the metal bit line 0, the metal bit line 1, the metal bit line 7, the metal bit line 6, the metal bit line 4, the metal bit line 5, and the metal bit line 3.

* * * * *